United States Patent
Poelloth et al.

(10) Patent No.: US 9,331,257 B2
(45) Date of Patent: May 3, 2016

(54) THERMOELECTRIC MODULE WITH A HEAT CONDUCTING LAYER AND METHOD OF MANUFACTURING A THERMOELECTRIC MODULE

(71) Applicants: EMITEC GESELLSCHAFT FUER EMISSIONSTECHNOLOGIE MBH, Lohmar (DE); BAYERISCHE MOTOREN WERKE AKTIENGESELLSCHAFT, Munich (DE)

(72) Inventors: Horst Poelloth, Munich (DE); Andreas Eder, Munich (DE); Matthias Linde, Munich (DE); Boris Mazar, Munich (DE); Sigrid Limbeck, Much (DE); Rolf Brueck, Bergisch Gladbach (DE)

(73) Assignees: EMITEC Gesellschaft fuer Emissionstechnologie mbH, Lohmar (DE); Bayerische Motoren Werke Aktiengesellschaft, Munich (DE)

( * ) Notice: Subject to any disclaimer, the term of this patent is extended or adjusted under 35 U.S.C. 154(b) by 124 days.

(21) Appl. No.: 13/951,694

(22) Filed: Jul. 26, 2013

(65) Prior Publication Data
US 2013/0305743 A1   Nov. 21, 2013

Related U.S. Application Data

(63) Continuation of application No. PCT/EP2012/051083, filed on Jan. 25, 2012.

(30) Foreign Application Priority Data

Jan. 26, 2011 (DE) .......................... 10 2011 009 428

(51) Int. Cl.
*H01L 35/30* (2006.01)
*B23P 15/26* (2006.01)
*F25B 21/04* (2006.01)

(52) U.S. Cl.
CPC .................. *H01L 35/30* (2013.01); *B23P 15/26* (2013.01); *F25B 21/04* (2013.01); *Y10T 29/49002* (2015.01)

(58) Field of Classification Search
CPC ....................................................... H01L 35/30
USPC .................................................. 136/208–209
See application file for complete search history.

(56) References Cited

U.S. PATENT DOCUMENTS 2,597,752 A * 5/1952 Salisbury ....................... 136/208
2,919,553 A * 1/1960 Fritts ................................ 62/3.3

(Continued)

FOREIGN PATENT DOCUMENTS

CN    2381023 Y    5/2000
CN    1541422 A    10/2004

(Continued)

OTHER PUBLICATIONS

International Search Report of PCT/EP2012/051083, Dated Jun. 28, 2012.

*Primary Examiner* — Allison Bourke
(74) *Attorney, Agent, or Firm* — Laurence A. Greenberg; Werner H. Stemer; Ralph E. Locher

(57) ABSTRACT

A thermoelectric module includes a cold side, a hot side and thermoelectric elements disposed between the two sides. At least one heat conducting layer is disposed between the thermoelectric elements and at least the cold side or the hot side and the heat conducting layer can be compressed. A method for producing a thermoelectric module having at least one heat conducting layer is also provided.

11 Claims, 4 Drawing Sheets

(56) References Cited

U.S. PATENT DOCUMENTS

| | | | |
|---|---|---|---|
| 2,959,925 A * | 11/1960 | Frantti | A47J 36/2433 136/204 |
| 3,234,048 A * | 2/1966 | Nelson | G21H 1/103 136/202 |
| 4,007,061 A | 2/1977 | Le Couturier | |
| 4,395,079 A * | 7/1983 | Yano et al. | 312/7.1 |
| 5,026,748 A | 6/1991 | Adams et al. | |
| 5,409,547 A | 4/1995 | Watanabe et al. | |
| 6,359,841 B1 | 3/2002 | Kotanagi et al. | |
| 6,410,971 B1 | 6/2002 | Otey | |
| 8,552,541 B2 | 10/2013 | Lim et al. | |
| 9,003,784 B2 | 4/2015 | Limbeck et al. | |
| 2007/0199587 A1 | 8/2007 | Takahashi | |
| 2009/0000309 A1* | 1/2009 | Hershberger et al. | 62/3.5 |
| 2009/0243078 A1 | 10/2009 | Lim et al. | |
| 2010/0229911 A1 | 9/2010 | Leavitt et al. | |
| 2011/0000516 A1 | 1/2011 | Hershberger et al. | |
| 2011/0314798 A1 | 12/2011 | Limbeck et al. | |
| 2012/0297755 A1* | 11/2012 | Adldinger | G02G 5/02 60/320 |

FOREIGN PATENT DOCUMENTS

| | | |
|---|---|---|
| CN | 101010813 A | 8/2007 |
| DE | 2525121 A1 | 12/1975 |
| DE | 102009009586 A1 | 8/2010 |
| JP | 09224387 A | 8/1997 |
| JP | H09293907 A | 11/1997 |
| JP | 2000075065 A | 3/2000 |
| JP | 2006217756 A | 8/2006 |
| KR | 1020090103599 A | 10/2009 |
| RU | 2052483 C1 | 1/1996 |
| RU | 2142177 C1 | 11/1999 |
| WO | 2010057578 A2 | 5/2010 |

* cited by examiner

THERMOELECTRIC MODULE WITH A HEAT CONDUCTING LAYER AND METHOD OF MANUFACTURING A THERMOELECTRIC MODULE

CROSS-REFERENCE TO RELATED APPLICATION

This is a continuation application, under 35 U.S.C. §120, of copending International Application No. PCT/EP2012/051083, filed Jan. 25, 2012, which designated the United States; this application also claims the priority, under 35 U.S.C. §119, of German Patent Application DE 10 2011 009 428.8, filed Jan. 26, 2011; the prior applications are herewith incorporated by reference in their entirety.

BACKGROUND OF THE INVENTION

Field of the Invention

The present invention relates to a thermoelectric module with a heat conducting layer and a method for the manufacture thereof.

The exhaust gas from an internal combustion engine of a motor vehicle contains thermal energy, which can be converted into electrical energy by using a thermoelectric generator, in order e.g. to charge a battery or another energy storage device and/or to directly deliver the required energy to electrical consumers. The motor vehicle is thereby operated with improved energy efficiency and energy is available for the operation of the motor vehicle to a greater extent.

Such a thermoelectric generator includes at least one thermoelectric module. Thermoelectric modules include e.g. at least two semiconductor elements (p-doped and n-doped), which are alternately provided with electrically conducting bridge elements on their upper side and underside (facing the hot side or the cold side). Those two semiconductor elements form the smallest thermoelectric unit or a thermoelectric element. Thermoelectric materials are of such a type that they can effectively convert thermal energy into electrical energy (Seebeck effect) and vice-versa (Peltier effect). If a temperature gradient is set up on the two sides of the semiconductor elements, then a voltage potential forms between the ends of the semiconductor elements. The charge carriers on the hotter side are increasingly stimulated in the conductance band by the higher temperature. As a result of the difference in concentration in the conductance band produced thereby, charge carriers diffuse to the colder side of the semiconductor element, resulting in the potential difference. In a thermoelectric module there are preferably numerous semiconductor elements connected electrically in series. In order to ensure that the produced potential differences of the serial semiconductor elements do not cancel each other out, alternate semiconductor elements with different majority charge carriers (n-doped and p-doped) are always brought into direct electrical contact. The circuit can be closed by using a connected electrical load and thus electrical power can be drawn off.

In order to ensure permanent operational capability of the semiconductor elements, a diffusion barrier, which is regularly disposed between electrically conducting bridge elements and the thermoelectric material, prevents diffusion of material contained in the electrical bridges or the connecting material (e.g. brazing material or solder) into the thermoelectric material and thus prevents a loss of effectiveness or a functional failure of the semiconductor material or of the thermoelectric element. The construction of thermoelectric modules or of the semiconductor elements normally takes place by the assembly of the individual components, that is the thermoelectric material, the diffusion barrier, the electrically conducting bridge elements, insulation and possibly other housing elements, to form a thermoelectric module, over which a hot or cold medium flows. The assembly of numerous individual components also requires accurate matching of the individual component tolerances and taking into account of heat transfers from the hot side to the cold side and adequate contacting of the electrically conducting bridges, so that a current flow through the thermoelectric material can be produced.

In order to configure such semiconductor elements in a thermoelectric module, housing walls (plate-shaped thermoelectric module) and/or supporting tubes for externally bounding a tubular thermoelectric module are regularly provided, to which the semiconductor elements are attached or between which they are disposed. That leads, in particular, to high tolerance requirements being specified during manufacture, in order to achieve an accurate configuration of the semiconductor elements on one hand in relation to the electrical connections and on the other hand in relation to the position of the housing. It is problematic, moreover, that as a result of the different thermal loads on the housing walls or supporting tubes, different expansion behaviors of the components also have to be compensated, without particularly high stresses being introduced into the thermoelectric material and the connections between the individual components.

SUMMARY OF THE INVENTION

It is accordingly an object of the invention to provide a thermoelectric module with a heat conducting layer and a method of manufacturing a thermoelectric module, which overcome the hereinafore-mentioned disadvantages and at least partly solve the highlighted problems of the heretofore-known modules and methods of this general type. In particular, a thermoelectric module is to be specified that can compensate different thermal expansions or that is not destroyed by them or is not restricted in its operation by them. In particular, furthermore, a method for the manufacture of a thermoelectric module is to be specified, with which on one hand the different thermal expansions occurring during operation of the thermoelectric module are taken into account and which on the other hand is particularly economically implemented in that larger component tolerances can be compensated.

With the foregoing and other objects in view there is provided, in accordance with the invention, a thermoelectric module, comprising at least one cold side, at least one hot side and thermoelectric elements disposed therebetween. At least one heat conducting layer is disposed between the thermoelectric elements and the cold side and/or between the thermoelectric elements and the hot side and the heat conducting layer is implemented so as to be compressible.

In particular, the thermoelectric module has a tubular construction, in which annular or annular segment-shaped semiconductor elements are disposed between an inner tube and an outer tube one after the other in the axial direction. Preferably, exhaust gas flows through the inner tube and a flow of coolant passes over the outer tube, so that the hot side of the thermoelectric module is disposed on the inside and the cold side of the thermoelectric module is disposed on the outside. Alternatively, the tubular thermoelectric module can also be implemented in the inverse manner, so that the exhaust gas flows over the outer tube. In particular, the thermoelectric module can also be implemented in a plate-shaped form, so that thermoelectric elements are disposed in planes adjacent each other. In this case one side is implemented as a cold side and an oppositely disposed side is implemented as a hot side, respectively. The following comments can be suitably applied to a plate-shaped thermoelectric module, although the present invention is especially advantageous for tubular thermoelectric modules.

In particular, the thermoelectric module is constructed in the direction towards the hot side as follows, starting from a cold side over which a cooling medium flows: cold side, electrical insulation, electrically conducting bridge elements, possibly a diffusion barrier, thermoelectric material, possibly a diffusion barrier, electrically conducting bridge elements, electrical insulation, hot side.

It is now provided that a heat conducting layer is disposed at least especially between an outer wall forming the cold side or the hot side and the electrically conducting bridge elements, which enables good thermal transfer between thermoelectric elements and the cold side or the hot side and on the other hand especially effects electrical insulation between the cold side and electrically conducting bridge elements or between the hot side and electrically conducting bridge elements.

The heat conducting layer can especially either be used together with the electrical insulation or can replace the layer of electrical insulation. The heat conducting layer is implemented in compressible form, which means that it can be compressed or can be reduced in volume by the application of an external pressure (especially at least partly elastically). This compressibility enables stresses within the thermoelectric module caused by thermal load to be absorbed by the heat conducting layer. This is possible because differently expanding components especially extend into the heat conducting layer, or bound on the same, and their expansion can be compensated by the compressible heat conducting layer. In particular, the heat conducting layer is implemented so that the reduction of the volume of the heat conducting layer is fully reversible. This makes it possible for the heat conducting layer to permanently and completely fill the region between the hot side and the thermoelectric elements or between the cold side and the thermoelectric elements, even with fluctuating thermal stresses.

The heat conducting layer has, in particular, a thermal conductivity (at room temperature, i.e. 20° C.) of at least 0.9 W/Km [Watt/(Kelvin*Meter)], especially of at least 9 W/Km and preferably of at least 50 W/Km. Preferably, the heat conducting layer has a specific electrical resistance of at least $1 \times 10^6$ Ωm [Ohm*Meter], especially of at least $1 \times 10^8$ Ωm and preferably of at least $1 \times 10^9$ Ωm.

Furthermore, in particular different component tolerances are compensated by the heat conducting layer, and this can already be taken into account during the structural layout of the thermoelectric module. Lower tolerance demands are thus placed on the components of the thermoelectric module that are installed together, so that the thermoelectric module is overall less costly to manufacture.

In accordance with another advantageous feature of the thermoelectric module of the invention, the at least one heat conducting layer is implemented in planar form and has a thickness. The heat conducting layer is compressible by at least 5 Vol.-% in a temperature range of 80 through 550° C., especially in a temperature range of 80 through 350° C., by a surface pressure of up to 60 N/cm$^2$ and thus can be reduced in its thickness. In particular, the heat conducting layer can be compressed by at least 10% in the above-mentioned temperature range for a surface pressure of up to 60 N/cm$^2$, wherein preferably a maximum of 25% can be achieved. In particular, the thickness of the (uncompressed) heat conducting layer lies in a range of 50 to 2000 μm [micrometers], preferably in a range of 50 to 150 μm, so that a thin and at the same time compressible heat conducting layer can be provided.

In accordance with a further advantageous feature of the thermoelectric module of the invention, the at least one heat conducting layer is a film or foil. The film or foil is especially flexible and pliable and can accordingly be disposed between the hot side and thermoelectric elements or between the cold side and thermoelectric elements.

In accordance with an added advantageous feature of the thermoelectric module of the invention, the at least one heat conducting layer can be attached by an adhesive at least to an outer wall of the thermoelectric module or/and through to the thermoelectric elements. The adhesive is especially suitable for sealing the thermoelectric module on the cold side and/or on the hot side against an exhaust gas or a cooling medium. Thus, the intermediate space of the thermoelectric module, in which inter alia the thermoelectric elements are disposed, can be implemented so as to be sealed gas-tightly or fluid-tightly against an exhaust gas and/or a cooling medium. In particular, the adhesive likewise has a very good thermal conductivity (at room temperature, i.e. 20° C.) of at least 0.9 W/Km [Watt/(Kelvin*Meter)], especially of at least 9 W/Km and preferably of at least 50 W/Km. Preferably, the adhesive has a specific electrical resistance of at least $1 \times 10^6$ Ωm [Ohm*Meter], especially of at least $1 \times 10^8$ Ωm and preferably of at least $1 \times 10^9$ Ωm.

In accordance with an additional advantageous feature of the thermoelectric module of the invention, the at least one heat conducting layer includes a heat conducting paste. The heat conducting paste is pasty and has, especially at room temperature, a viscosity of at least 1 N/m$^2$ [Newtons per square meter], preferably between 5 N/m$^2$ and 50 N/m$^2$. The use of a heat conducting paste especially requires an additional electrical insulation layer. Whereas the heat conducting layer, if implemented as a film or foil, is to be used in a specific size or in a specific thickness, the heat conducting layer, if used as a heat conducting paste, is only defined by a specific quantity (volume at room temperature and atmospheric pressure, i.e. approx. 20° C. and 1 bar). In particular, the heat conducting paste contains the following materials: graphite, silicone. In particular, the heat conducting paste is made in silicone-free form. The heat conducting paste can especially contain metallic constituents, e.g. aluminum. The metallic constituents are especially present in powdered form in the heat conducting paste and effect a high thermal conductivity and high thermal durability of the heat conducting paste.

In accordance with yet another advantageous feature of the thermoelectric module of the invention, the at least one heat conducting layer includes a silicone elastomer/silicone rubber. This can especially be implemented as a film or foil or as a heat conducting paste.

Preferably, the heat conducting paste is used with plate-shaped thermoelectric modules. The heat conducting film or foil can additionally be used with tubular thermoelectric modules.

In accordance with yet a further advantageous feature of the thermoelectric module of the invention, the at least one heat conducting layer is reinforced with fibers. The fibers are thereby especially interlinked so that the heat conducting layer has greater strength or stiffness or tear strength. The compressibility or deformability of the heat conducting layer can also be adapted through the use of fibers. Glass fibers are especially used as the fibers. They are, in particular, embedded in a silicone rubber.

With the objects of the invention in view, there is also provided a method of manufacturing a thermoelectric module, comprising at least the following steps:

a) providing an inner tube,
b) placing thermoelectric elements on the inner tube,
c) placing electrically conducting bridge elements for electrically conducting connection of the thermoelectric elements to each other, so that a first tubular assembly with an outer circumferential surface is produced,
d) placing a compressible heat conducting layer on the outer circumferential surface,
e) providing an outer tube, and
f) calibrating the outer tube so that the heat conducting layer is compressed.

In particular, a reduction of the diameter of the outer tube takes place through the calibration of the outer tube, so that (only) the heat conducting layer disposed within the outer tube between the thermoelectric elements and the outer tube is compressed. In particular, a pressure between 10 and 100 N/cm$^2$ is applied, wherein especially the outer tube and possibly also the thermoelectric module are additionally heated up to a temperature of no higher than 400° C.

In particular, the outer tube is reduced in its diameter by the calibration in such a way that the heat conducting layer disposed therein is compressed by at least 5 Vol.-% and is thus reduced in its thickness, especially by 5%. In particular, a reduction of the thickness or a compression of the volume of at least 10% and preferably at most 25% is achieved. Through the compression of the heat conducting layer it is possible that especially the thermoelectric elements but also other components can be implemented with larger tolerances, especially in the radial direction of the thermoelectric module, because stress peaks on the individual components, which are otherwise caused by the calibration, are prevented by the configuration of the heat conducting layer.

The heat conducting layer is especially compressed with different strengths at different points, so that the values described above in relation to the thickness and the compressible volume can only be viewed as average values over the entire extent of the heat conducting layer. In particular, it is possible that individual point regions are compressed to a greater or lesser extent, so that the material of the heat conducting layer is displaced differently at different positions. However, there is preferably a uniform density of the material of the heat conducting layer over the entire extent of the heat conducting layer, so that in particular approximately constant properties exist over the entire extent of the heat conducting layer (in relation to thermal conduction and electrical insulation of the heat conducting layer or similar).

In particular, the following intermediate steps occur between step a) and step b):

i. applying an insulating layer to the inner tube,
ii. providing electrically conducting bridge elements for electrically conducting connection of the thermoelectric elements to each other.

In accordance with another advantageous mode of the method of the invention, additionally a heat conducting layer is disposed between the inner tube and the thermoelectric elements. In particular, it is proposed herein that the calibration also takes place by using the outer tube, wherein the inner tube is stabilized, e.g. by using a mandrel, so that a reduction of the diameter of the inner tube does not take place in this case, but only a compression of the installation space between the inner tube and the outer tube takes place. Alternatively, a calibration (e.g. using a liquid pressure medium) can take place by itself or additionally on the inner tube.

In accordance with a concomitant advantageous mode of the method of the invention, only the outer tube is plastically deformed by the calibration, so that there is especially no variation of the diameter of the inner tube during calibration of the outer tube.

In general it should be noted that the thermoelectric elements are not damaged during the calibration. However, especially with annular segment-shaped semiconductor elements, a positional displacement of the semiconductor elements as a result of the calibration can be tolerated. Likewise, it is preferably possible for at least the semiconductor elements to be sintered as a result of the calibration pressure, so that a heat conducting layer disposed between the inner tube and the semiconductor elements can thus also be at least partly compressed. Furthermore, e.g. preferred break points can be provided in the semiconductor elements, so that on one hand they are preferably installed as annular elements, but on the other hand, they can contribute to a positional displacement resulting from the calibration without other unwanted stress cracks occurring.

With a plate-shaped thermoelectric module, the problems in relation to placing another heat conducting layer on the inner tube do not arise because in this case the structural layout and also the method can be implemented "symmetrically." The above comments can, however, be applied accordingly to plate-shaped thermoelectric modules.

In particular, through the use of the proposed thermoelectric module or through the use of the method, the use of a brazing material or solder material for joining the hot side or the cold side to the thermoelectric elements is avoided. In particular, a brazing material-free or solder-free configuration or a brazing material-free or solder-free method for the manufacture of a thermoelectric module is also proposed, so that assembly of the configuration in an outer tube is possible, without a bonded connection being indirectly or directly produced between the thermoelectric elements and the outer tube and/or the inner tube. The term "indirectly" refers e.g. to the configuration of a brazing material or solder joint between an electrical insulation layer and the outer tube or the inner tube or between the electrically conducting bridge elements and the electrical insulation layer, so that thermoelectric elements and the cold side or the hot side are thus not directly connected to each other by the brazing material or solder joint. The term "bonded" refers to a connection of components to each other that are held together by atomic or molecular forces. These are especially non-reversible joints, which can only be separated by destroying the connecting device.

In particular, the thermoelectric module can be used in a thermoelectric generator, which is preferably used in the exhaust gas system of an internal combustion engine in a motor vehicle.

Through the use of the present invention it is possible to provide or manufacture a thermoelectric module, with which only supportable and feasible requirements have to be placed on the tolerances of the individual components that are combined with each other. The component tolerances are already compensated during the manufacture of the thermoelectric module by the compressible heat conducting layer. In addition, the different expansion of individual components as a result of thermal loading during operation is also compensated by the heat conducting layer. Furthermore, the sensitivity to (different) thermal expansions can be reduced by not using a bonded connection (brazing material or solder joint) between thermoelectric elements and the hot side or the cold side that is also stiff (not flexible) at least in a radial direction. The use of a compressible heat conducting layer thus enables, for the first time, the use of a thermoelectric module that is resistant to alternating thermal loads in the long term without complex structural measures for compensating thermal stresses having to be provided.

It is expressly noted that features that have been described in connection with the thermoelectric module or with the motor vehicle can also be used with the method or with plate-shaped thermoelectric modules and vice-versa.

Other features which are considered as characteristic for the invention are set forth in the appended claims, noting that the features individually listed in the claims can be combined with each other in any technologically purposeful manner and demonstrate other embodiments of the invention.

Although the invention is illustrated and described herein as embodied in a thermoelectric module with a heat conducting layer and a method of manufacturing a thermoelectric module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings. The description, especially in combination with the figures, explains the invention further and cites additional examplary embodiments of the invention.

DETAILED DESCRIPTION OF THE INVENTION

Figure 1:
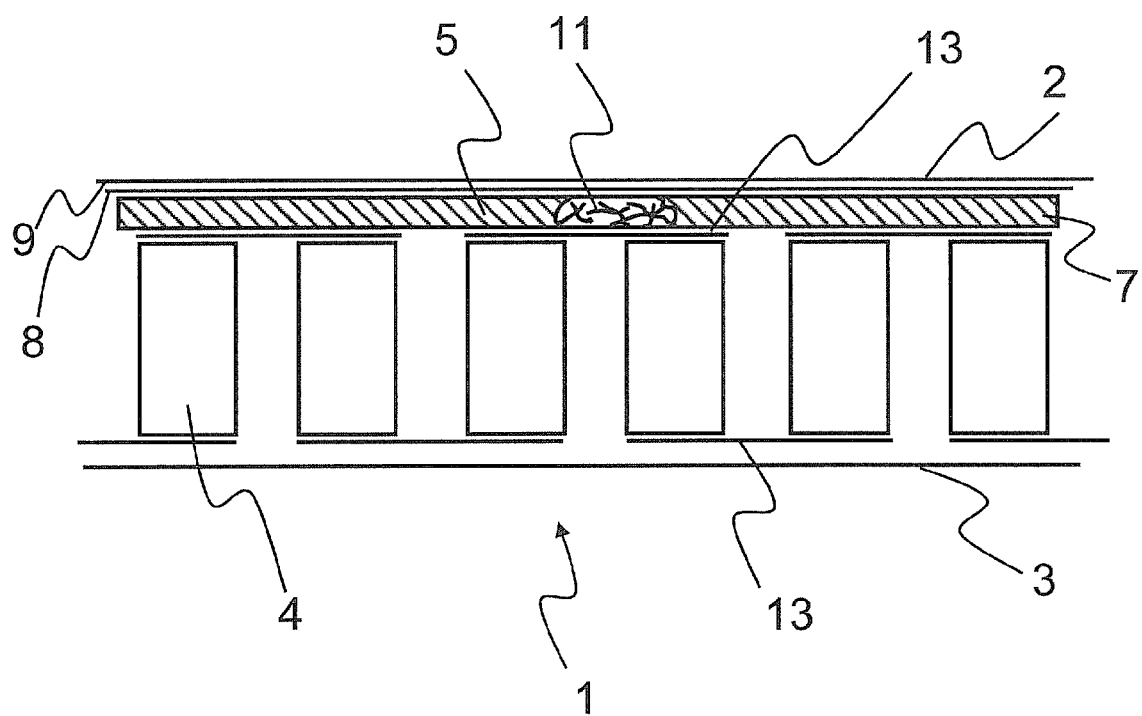
FIG. 1 is a diagrammatic, longitudinal-sectional view of a thermoelectric module with a heat conducting layer.

Referring now to the figures of the drawings in detail and first, particularly, to FIG. 1 thereof, there is seen a plate-shaped thermoelectric module 1, in which thermoelectric elements 4 are disposed between a cold side 2 and a hot side 3 so as to be mutually adjacent in a plane. The thermoelectric elements 4, which are each formed by at least one n-doped and at least one p-doped semiconductor element, are alternately connected to each other by electrically conducting bridge elements 13. A compressible heat conducting layer 5, shown herein as a film or foil 7, is provided between the electrically conducting bridge elements 13 and the cold side 2. Furthermore, an adhesive 8 is disposed between the heat conducting layer 5 and the cold side 2, so that the heat conducting layer 5 and the cold side 2 are adhesively joined to each other. The heat conducting layer 5 is thus bonded at least to an outer wall 9 of the thermoelectric module 1 by using an adhesive 8. A section of the heat conducting layer 5 shows that it includes fibers 11.

Figure 2:
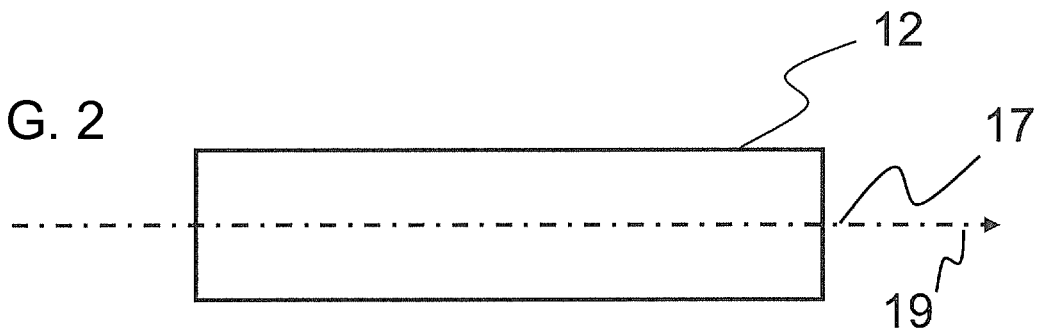
FIG. 2 is a plan view showing a step a) of a production method.

FIG. 2 shows a step a) of a method for the manufacture of a thermoelectric module 1, in which an inner tube 12 is provided that extends along a central axis 17 in an axial direction 19.

In the following figures only individual components of a thermoelectric module 1 are shown, wherein e.g. the configuration of electrically conducting bridge elements 13 on the inner side of the thermoelectric elements 4 is also self-evident to a person skilled in the art and has accordingly been omitted.

Figure 3:
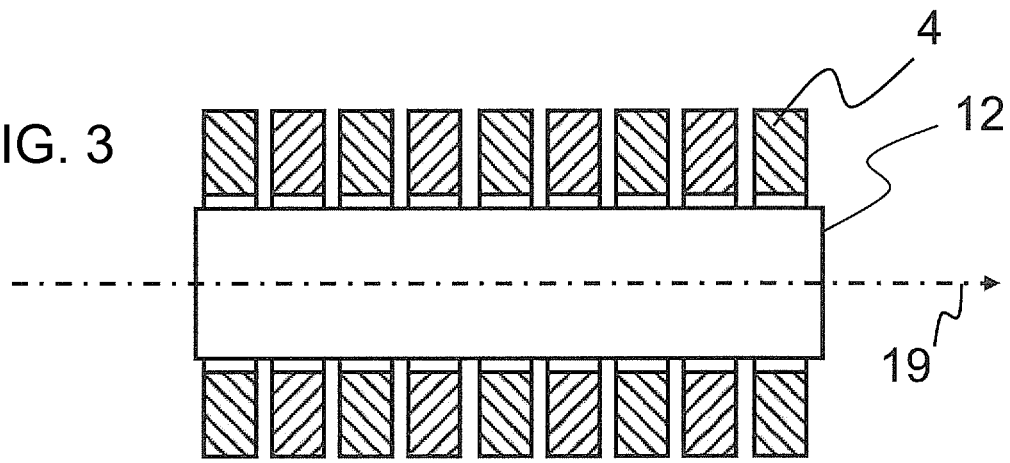
FIG. 3 is a partly-sectional view showing a step b) of a production method.

FIG. 3 shows a step b) of the method for the manufacture of a thermoelectric module, in which annular thermoelectric elements 4 are disposed one after the other in an axial direction 19 on the inner tube 12. The thermoelectric elements 4 are each formed by an n-doped and a p-doped semiconductor element, which are disposed adjacent each other (and differently shaded).

Figure 4:
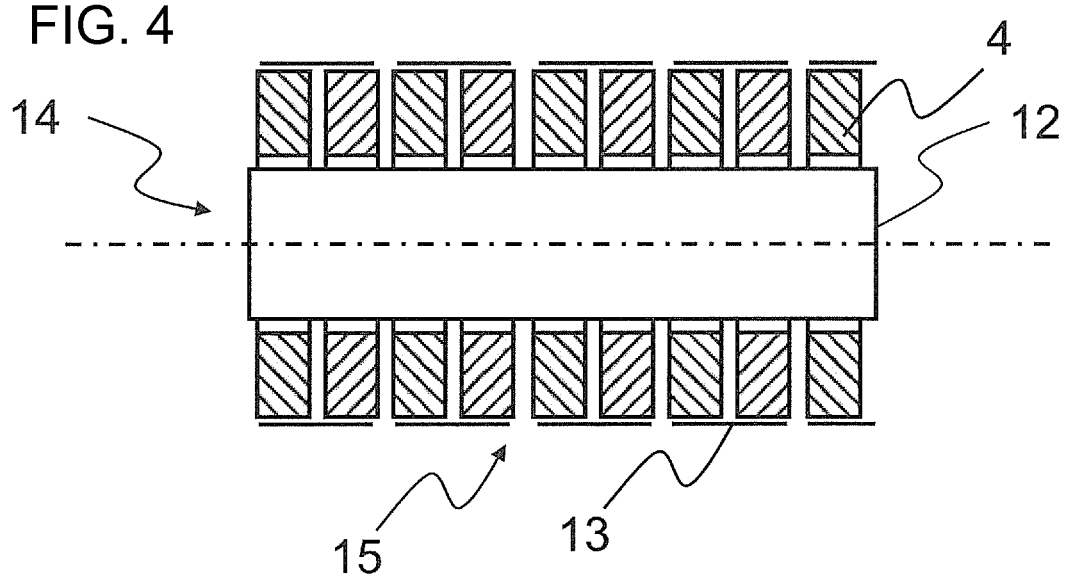
FIG. 4 is a partly-sectional view showing a step c) of a production method.

FIG. 4 shows a step c) of the manufacturing method of a thermoelectric module, in which the alternately disposed n-doped and p-doped semiconductor elements are connected to each other in an electrically conducting manner to form thermoelectric elements 4, so that a current path can be produced through the thermoelectric module. An outer circumferential surface 15 is formed by the electrically conducting bridge elements 13. An assembly 14 is formed by step c) of the method.

Figure 5:
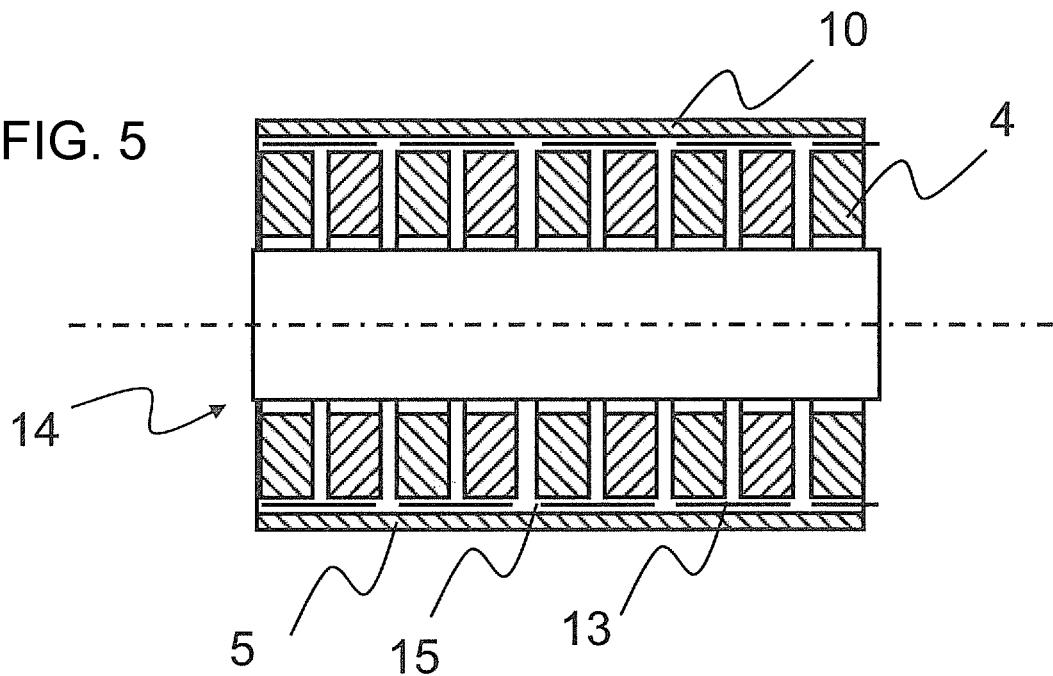
FIG. 5 is a partly-sectional view showing a step d) of a production method.

FIG. 5 shows a step d) of the method for the manufacture of a thermoelectric module, in which a compressible heat conducting layer 5 is disposed on the outer circumferential surface 15 of the assembly 14 formed at least by the electrically conducting bridge elements 13. The heat conducting layer 5 is applied in this case as a heat conducting paste 10.

Figure 6:
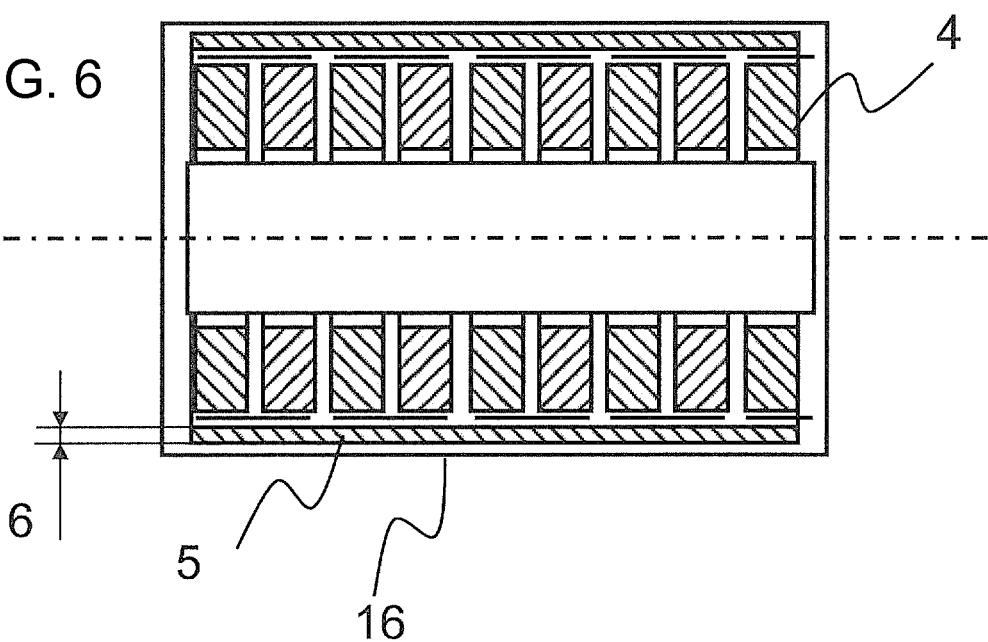
FIG. 6 is a partly-sectional view showing a step e) of a production method.

FIG. 6 shows a step e) of the method for the manufacture of a thermoelectric module, in which an outer tube 16 is pushed onto the heat conducting layer 5 so that the heat conducting layer 5 is disposed between the outer tube 16 and the thermoelectric elements 4. The heat conducting layer 5 has a thickness 6 which is (still) not compressed.

Figure 7:
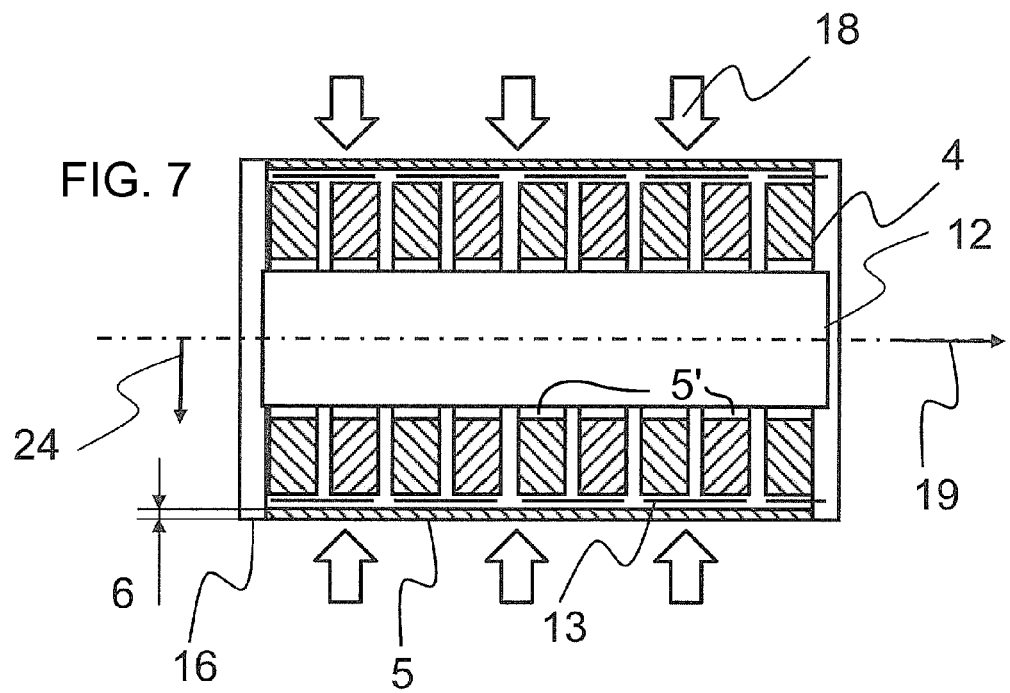
FIG. 7 is a partly-sectional view showing a step f) of a production method.

FIG. 7 shows a step f) of the method for the manufacture of a thermoelectric module, in which the outer tube 16 is calibrated by using a pressure 18 so that the heat conducting layer 5 is compressed and the thickness 6 is correspondingly reduced. A thermally conducting bonding of the cold side 2 and the hot side 3 thus takes place, at least in a radial direction 24, by providing a connection without gaps of the inner tube 12, the thermoelectric elements 4, the heat conducting layer 5 and the outer tube 16. The radial gap shown therein between the thermoelectric elements 4 and the inner tube 12 is filled by the thermoelectric module, e.g. by electrical insulation and electrically conducting bridge elements. The gap in the axial direction 19 between the thermoelectric elements 4 which is likewise shown is especially filled by an electrical and thermal insulator. An additional heat conducting layer may be placed at a location 5' between the inner tube 12 and the thermoelectric elements 4.

Figure 8:
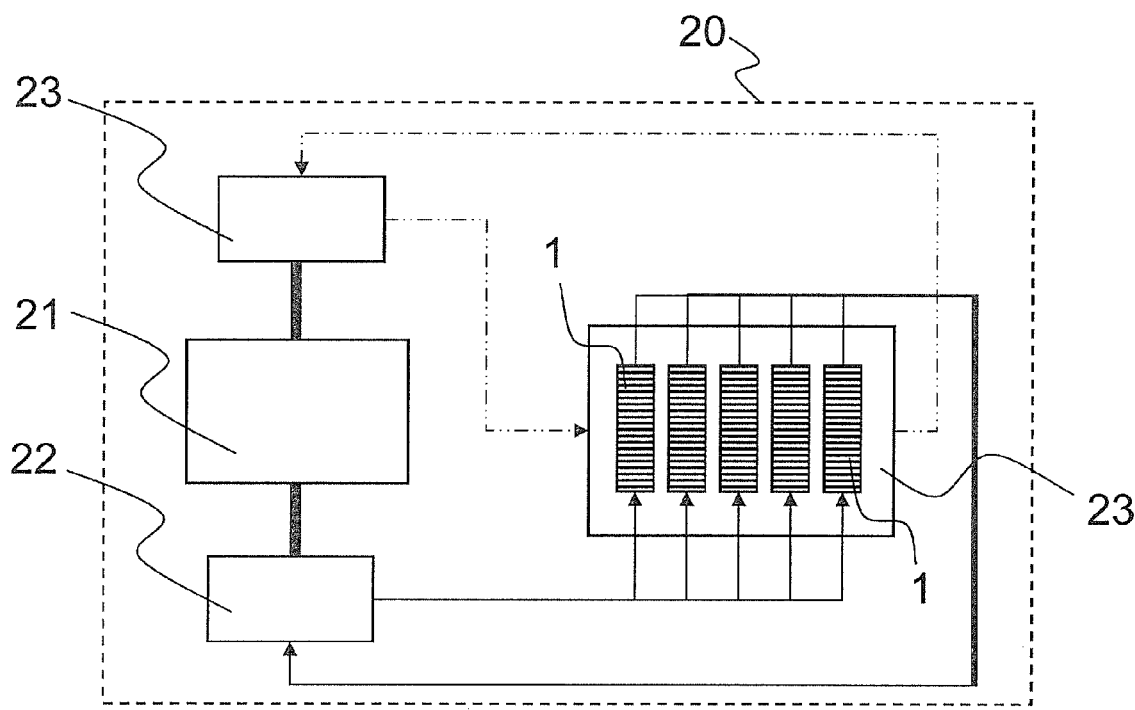
FIG. 8 is a block diagram of a motor vehicle with an exhaust gas treatment device.

FIG. 8 shows a motor vehicle 20 with an internal combustion engine 21 and an exhaust gas treatment device 22. The exhaust gas treatment device 22 carries a throughflow of an exhaust gas, which is also fed to a plurality of thermoelectric modules 1. In order to form a temperature potential over the thermoelectric modules 1, they are subjected at the same time to a cooling medium of a cooling apparatus 23, in which case the cooling apparatus 23 is also provided for cooling the internal combustion engine 21.

The invention claimed is:

1. A tubular thermoelectric module, comprising:
an inner tube and a calibrated outer tube, one of said inner and calibrated outer tubes forming a cold side of the tubular thermoelectric module, and the other of said inner and calibrated outer tubes forming a hot side of the tubular thermoelectric module;
annular or annular segment-shaped thermoelectric elements disposed on said inner tube between said inner tube and said calibrated outer tube;
electrically conducting bridge elements electrically conductively interconnecting said annular or annular segment-shaped thermoelectric elements and forming a first tubular assembly with an outer circumferential surface;
at least one compressible heat conducting layer disposed on said outer circumferential surface between said annular or annular segment-shaped thermoelectric elements and at least one of said inner tube or said calibrated outer tube, said at least one compressible heat conducting layer having a thickness;
said at least one compressible heat conducting layer being compressed by said calibrated outer tube by at least 5 Vol.-% in a temperature range of 80 to 550° C. at a surface pressure of up to 60 Newton/cm$^2$ and thus being reduced in its thickness; and
said calibrated outer tube being disposed outside said at least one compressible heat conducting layer.

2. The thermoelectric module according to claim 1, wherein said at least one compressible heat conducting layer is a film or foil.

3. The thermoelectric module according to claim 1, which further comprises an outer wall of the tubular thermoelectric module, and an adhesive attaching said at least one compressible heat conducting layer at least to said outer wall or in addition to said thermoelectric elements.

4. The thermoelectric module according to claim 1, wherein said at least one compressible heat conducting layer contains a heat conducting paste.

5. The thermoelectric module according to claim 1, wherein said at least one compressible heat conducting layer contains a silicone elastomer.

6. The thermoelectric module according to claim 1, wherein said at least one compressible heat conducting layer is reinforced with fibers.

7. A method for manufacturing a tubular thermoelectric module, the method comprising the following steps:
a) providing an inner tube forming a cold side or a hot side of the tubular thermoelectric module;
b) placing annular or annular segment-shaped thermoelectric elements on the inner tube;
c) electrically conductively interconnecting the annular or annular segment-shaped thermoelectric elements using electrically conducting bridge elements, to produce a first tubular assembly with an outer circumferential surface;
d) placing a compressible heat conducting layer on the outer circumferential surface, the heat conducting layer having a thickness;
e) providing an outer tube forming a hot side or a cold side of the tubular thermoelectric module; and
f) calibrating the outer tube to compress the compressible heat conducting layer by at least 5 Vol.-% in a temperature range of 80 to 550° C. at a surface pressure of up to 60 Newton/cm$^2$ and thus reducing the thickness of the compressible heat conducting layer.

8. The method according to claim 7, which further comprises additionally placing a second heat conducting layer between the inner tube and the annular or annular segment-shaped thermoelectric elements.

9. The method according to claim 7, which further comprises plastically deforming only the outer tube by the calibrating step.

10. The thermoelectric module according to claim 1, wherein said at least one compressible heat conducting layer is disposed on said outer circumferential surface between said annular or annular segment-shaped thermoelectric elements and said calibrated outer tube and an additional heat conducting layer is disposed between said inner tube and said thermoelectric elements.

11. The thermoelectric module according to claim 1, wherein only said calibrated outer tube is plastically deformed.

* * * * *